United States Patent
Frey et al.

(10) Patent No.: US 9,606,141 B2
(45) Date of Patent: Mar. 28, 2017

(54) MICROMECHANICAL SENSOR DEVICE

(71) Applicant: Robert Bosch GmbH, Stuttgart (DE)

(72) Inventors: Jens Frey, Filderstadt (DE); Arnd Kaelberer, Schlierbach (DE); Jochen Reinmuth, Reutlingen (DE); Johannes Classen, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 165 days.

(21) Appl. No.: 14/534,860

(22) Filed: Nov. 6, 2014

(65) Prior Publication Data

US 2015/0122023 A1 May 7, 2015

(30) Foreign Application Priority Data

Nov. 7, 2013 (DE) .................. 10 2013 222 616

(51) Int. Cl.
  *G01P 1/02* (2006.01)
  *G01P 15/18* (2013.01)
  *G01P 15/105* (2006.01)
  *G01P 15/08* (2006.01)

(52) U.S. Cl.
  CPC ............ *G01P 15/105* (2013.01); *G01P 1/023* (2013.01); *G01P 15/08* (2013.01); *G01P 15/0802* (2013.01); *H01L 2224/16* (2013.01); *Y10T 29/49002* (2015.01)

(58) Field of Classification Search
  CPC .... G01P 15/125; G01P 15/18; G01P 15/0802; G01P 1/023; B81C 1/00238; B81C 1/00333; B81C 1/00246; B81C 1/00674

USPC .................. 73/514.32, 514.31, 493, 510
See application file for complete search history.

(56) References Cited

U.S. PATENT DOCUMENTS

| | | | |
|---|---|---|---|
| 7,250,353 B2 | 7/2007 | Nasiri et al. | |
| 7,322,240 B2* | 1/2008 | Robert | G01P 15/0802 73/514.32 |
| 7,335,971 B2* | 2/2008 | Funk | G01P 1/023 257/686 |
| 7,442,570 B2 | 10/2008 | Nasiri et al. | |
| 8,186,221 B2* | 5/2012 | Lin | B81B 7/0074 73/493 |
| 2010/0109102 A1 | 5/2010 | Chen et al. | |
| 2010/0242603 A1* | 9/2010 | Miller | B81B 7/02 73/514.32 |
| 2011/0012247 A1 | 1/2011 | Wu | |
| 2011/0049652 A1 | 3/2011 | Wu et al. | |
| 2011/0056295 A1* | 3/2011 | Classen | B81B 7/02 73/514.32 |
| 2012/0032283 A1* | 2/2012 | Frey | G01P 15/0802 257/415 |
| 2012/0049299 A1 | 3/2012 | Chou | |
| 2012/0119312 A1 | 5/2012 | Kuisma | |

(Continued)

FOREIGN PATENT DOCUMENTS

DE  10 2007 048604  4/2009

*Primary Examiner* — Helen Kwok
(74) *Attorney, Agent, or Firm* — Gerard Messina

(57) ABSTRACT

A micromechanical sensor device, having a first unhoused sensor unit, and at least one second unhoused sensor unit, the sensor units being functionally connected to one another, the sensor units being essentially vertically configured one over the other so that a sensor unit having a larger footprint completely covers a sensor unit having a smaller footprint.

11 Claims, 3 Drawing Sheets

(56) References Cited

U.S. PATENT DOCUMENTS

2013/0285165 A1* 10/2013 Classen .............. B81C 1/00238
                                                              257/415
2013/0299928 A1* 11/2013 Classen ................ B81B 3/0075
                                                              257/417

* cited by examiner

MICROMECHANICAL SENSOR DEVICE

RELATED APPLICATION INFORMATION

The present application claims priority to and the benefit of German patent application no. 10 2013 222 616.0, which was filed in Germany on Nov. 7, 2013, the disclosure of which is incorporated herein by reference.

FIELD OF THE INVENTION

The present invention relates to a micromechanical sensor device. The present invention also relates to a method for producing a micromechanical sensor device.

BACKGROUND INFORMATION

Micromechanical sensors for measuring acceleration, rotational speed, and magnetic field are known and are produced in mass quantities for various automotive and consumer applications. Conventionally, for consumer applications the various sensed variables are still represented predominantly by separate sensor modules in the form of three-axis acceleration sensors, three-axis rotational speed sensors, and three-axis magnetic field sensors; however, there is a trend toward system integration, i.e., a realization of 6D elements as a compass module (measurements of acceleration and magnetic field), or IMU (Inertial Measurement Unit; measurements of acceleration and rotational speed), or 9D elements (measurements of acceleration and rotational speed and magnetic field).

In the existing art, standardly a plurality of chips for the various measured variables are installed in a plastic housing (e.g. LGA, BGA, QFN), as a so-called system-in-package (SiP). The named systems have differently separated chips that are functionally connected by a wired connection or via solder bumps.

Alternatively, MEMS and ASIC chips can be vertically integrated already at the wafer level. Here, vertical integration refers to the joining of MEMS and ASIC wafers as a composite, producing electrical contacts between the MEMS functional elements and the ASIC. Examples of vertical integration methods are discussed for example in U.S. Pat. Nos. 7,250,353 B2; 7,442,570 B2; US 2010 0109102 A1; US 2011 0049652 A1; US 2011 0012247 A1; US 2012 0049299 A1; and DE 10 2007 048604 A1.

In addition to plastic packagings, so-called "bare-die" systems are also known in which silicon chips are soldered onto the application circuit boards directly via solder bumps. Because these systems do not make use of plastic packaging, these sensors are distinguished by particularly small footprints. Bare-die designs of MEMS inertial sensors are known. In such conventional acceleration and rotational speed sensors, an ASIC, whose surface is significantly smaller than the surface of the MEMS element, is connected to the MEMS element via small solder bumps. The MEMS element includes a redistribution layer that enables a flexible wiring and that can be provided for external contacting with large solder bumps, whose height exceeds the ASIC thickness plus the thickness of the small solder bumps. A corresponding sensor device is described for example in US 2012 0119312 A1, in which each MEMS element is connected to an ASIC component and, depending on the existing size conditions, either the MEMS or the ASIC component is provided with external contacts.

For the magnetic sensor mechanism, various physical principles and measurement methods are used, such as resistive measurements of magnetoresistive layers (AMR, GMR), measurements of the inductance in soft-magnetic materials (flux gate or flip core design), or exploitation of the Hall effect. Many of the named technical solutions require an application of additional magnetic or magnetoresistive layers, thus increasing the complexity and costs of the production process. In particular, methods are standard in which the magnetic or magnetoresistive layers are applied directly on a CMOS-ASIC.

Increasingly, sensor modules are also being made "more intelligent," meaning that a stronger pre-processing of the sensor data is carried out in order to calculate for example quaternions therefrom, and to give this already pre-processed information externally to the applications. For this process, additional microcontroller functionalities are required; here, microcontrollers can in principle be integrated into the sensor ASIC or can be used separately.

DISCLOSURE OF THE INVENTION

An object of the present invention is to provide an improved highly integrated micromechanical sensor.

According to a first aspect, the object may be achieved by a micromechanical sensor device having:
 a first unhoused sensor unit; and
 at least one second unhoused sensor unit, the sensor units being functionally connected to one another, the sensor units being configured essentially vertically one over the other in such a way that a sensor unit having a larger footprint completely covers a sensor unit having a smaller footprint.

According to a second aspect, the object may be achieved by a method for producing a micromechanical sensor device having the steps:
 formation of a first unhoused sensor unit;
 formation of a second unhoused sensor unit;
 functional connection of the two sensor units; and
 configuration vertically to one another of the two sensor units in such a way that the two sensor units are essentially configured vertically one over the other in such a way that a sensor unit having a larger footprint completely covers a sensor unit having a smaller footprint.

Advantageously, the sensor device according to the present invention has a smaller space requirement on an application circuit board. Due to the fact that a bare-die design is used having no packaging, a very high degree of integration can in addition be achieved for the sensor device. For the case in which the first sensor unit has a large surface requirement, a plurality of second sensor units can also be realized according to the design of the present invention along with the first sensor unit, to create the sensor device.

Specific embodiments of the device according to the present invention and of the method according to the present invention are the subject matter of subclaims.

A specific embodiment of the sensor device according to the present invention is distinguished in that the sensor units are functionally connected to one another by first solder bumps, and the sensor device can be externally contacted by second solder bumps. In this way, a flip-chip design is realized with which a reliable and low-cost electrical contacting of the sensor device is enabled.

A further specific embodiment of the sensor device according to the present invention is distinguished in that the first sensor unit includes a MEMS structure and an ASIC wafer. In this way, according to the design of the present invention and inertial sensor is realized in which an evaluation circuit is fastened on the ASIC wafer thereof.

A further specific embodiment of the sensor device according to the present invention provides that an electrically conductive bonded connection is fashioned between the two sensor units, electrical vias being fashioned in the ASIC wafer, and the two sensor units being capable of being contacted electrically to one another by the bonded connection and the vias. In this way, with the ASIC wafer a capping is provided for the MEMS element. The electrically conductive bonded connection has two functions: on the one hand, it provides tightness for the sensor device, and on the other hand it creates the electrical connection between the sensor units.

A further advantageous development of the sensor device according to the present invention provides that the ASIC wafer in addition has an electrical redistribution device. This provides a possibility of realizing a flexible electrical wiring and of attaching the solder bumps by which the overall sensor device is contacted to the application circuit board.

A further specific embodiment of the sensor device according to the present invention provides that the second sensor unit has at least one of the following: a magnetic sensor, an ASIC chip, a radio module, a microcontroller. In this way, advantageously many different sensor designs can be realized that can acquire and process a plurality of different physical measured variables.

A further specific embodiment of the sensor device according to the present invention provides that the first sensor unit is a 9D sensor. In this way, a magnetic sensor system can advantageously already be integrated in the first sensor unit. Using an additional microcomputer, for example a signal pre-processing can be carried out.

According to a further specific embodiment of the sensor device according to the present invention, it is provided that the first sensor unit has a capping wafer, the second sensor unit being situated on the capping wafer, the capping wafer having electrical vias, and the capping wafer being bonded onto the ASIC wafer by the bonded connection. In this variant, the capping wafer assumes the function of provision of tightness or hermetic sealing of the overall sensor device, as well as guiding electrical contacts downward.

According to a further specific embodiment of the sensor device, it is provided that the capping wafer is bonded by the bonded connection onto a micromechanical functional layer of the MEMS structure. In this way, an alternative production process can advantageously be realized for the sensor device according to the present invention.

According to a further specific embodiment of the sensor device, it is provided that the capping wafer includes a further ASIC wafer. In this way, still greater integration density can advantageously be achieved for the sensor device.

A specific embodiment of the sensor device according to the present invention is distinguished in that, after a soldering process, a vertical extension of the second solder bumps is greater than an overall vertical extension of the first solder bumps and the second sensor unit. This specific dimensioning of the solder bumps enables the at least one second sensor unit to be situated completely underneath the first sensor unit, and enables an electrical contacting of the overall sensor device on an application circuit board.

In the following, the present invention is described in detail, with further features and advantages, on the basis of a plurality of Figures. Here, all described or represented features, alone or in arbitrary combination, form the subject matter of the present invention, independent of their summarization in the patent claims or their relations of dependence, and independent of their formulation or presentation in the description or in the Figures. The Figures are above all intended to illustrate the designs essential to the present invention. Identical or functionally identical elements have been provided with identical reference characters.

DETAILED DESCRIPTION

Figure 1:
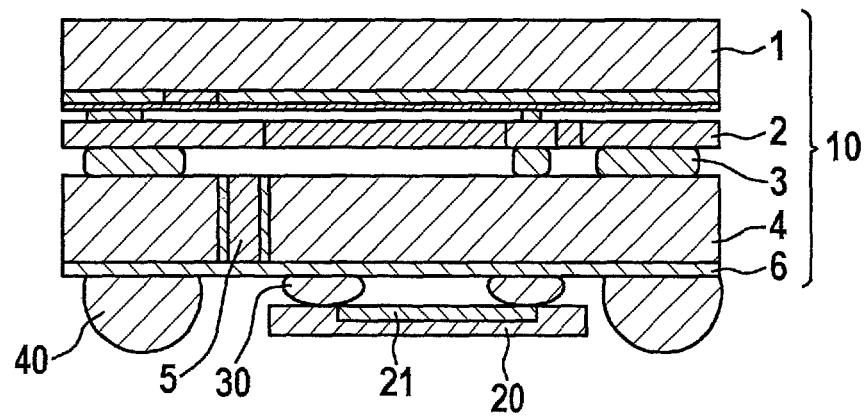
FIG. 1 shows a first specific embodiment of a micromechanical sensor device according to the present invention.

FIG. 1 shows a sectional view of a first specific embodiment of micromechanical sensor device 100 according to the present invention. A first sensor unit 10 has a substrate 1 that is situated on a micromechanical functional layer 2. In this way, a MEMS structure is realized by substrate 1 and micromechanical functional layer 2. Via an electrically conductive bonded connection 3, the MEMS structure is connected in electrically conductive fashion to an ASIC wafer 4. Inside ASIC wafer 4, there are fashioned one or more electrical through silicon vias 5 that guide electrical signals from the active circuit side of ASIC 4 to one or more redistribution layers 6 on the rear side of ASIC wafer 4. Here, there takes place an electrical redistribution, as well as the possibility of applying solder bumps 30, 40 onto defined pads. First solder bumps 30 are used to solder a second sensor unit 20 on ASIC wafer 4, and thus also to enable an electrical signal flow between first sensor unit 10 and second sensor unit 20.

Second sensor unit 20 can for example be fashioned as a magnetic sensor having a magnetoresistive layer 21, as a microprocessor, as a radio module, or the like. It will be seen that the overall sensor device 100 has second solder bumps 40 on the underside of ASIC wafer 4, by which sensor unit 100 can be electrically contacted onto a circuit board (not shown). After a soldering-on process, a height of second solder bumps 40 should be greater than a vertical dimension of first solder bumps 30 with second sensor unit 20.

This makes it possible for second sensor unit 20 to be situated essentially completely underneath first sensor unit 10, and to be mounted on the circuit board in such a way that second sensor unit 20 does not contact the application circuit board. As a result, this advantageously saves space and thus achieves a very high integration density of the depicted bare-die sensor structure. For the case in which second sensor unit 20 has a significantly smaller footprint than does first sensor unit 10, it is possible in this way to place a plurality of second sensor units 20 completely underneath first sensor unit 10.

FIG. 1 thus shows a possible realization of a 9D sensor. For this purpose, first a second sensor unit 20 in the form of an integrated magnetic sensor having a separate electronic evaluation circuit, and a first sensor unit 10 as an integrated inertial sensor, which may be as a 6D element, are produced separately. The inertial sensor may be capped in order to protect micromechanical functional layers 2 and, if necessary, to enclose a defined internal pressure, or, in the case of separate caverns for the rotational speed sensor and the acceleration sensor, two different defined internal pressures.

As is shown in FIG. 1, in a realization ASIC wafer 4 is used as a capping device of the inertial MEMS element having MEMS substrate 1 and micromechanical functional layer 2. However, other forms of the vertical or monolithic integration and capping for the inertial sensor are also possible, for example as presented in the existing art references named above.

Solder bumps 30, 40 are situated on pads provided for this purpose, on the one or more redistribution layers 6. In addition to other factors, the surface of the pads determines the size (diameter and height) of solder bumps 30, 40. It is thus in particular possible, given suitable process guiding, to apply both second solder bumps 40 with a large height and also first solder bumps 30 with a significantly lower height in a single process step. Small first solder bumps 30 enable the assembly of integrated second sensor unit 20 in the form of a magnetic sensor on the rear side of inertial ASIC wafer 4, while, in contrast, large second solder bumps 40 provide an external electrical contacting of the 9D sensor realized in this way on an application circuit board (not shown).

However, it is also possible to configure first solder bumps 30 and second solder bumps 40 in successive, separate process steps. In particular, first the first solder bumps 30 can be situated on second sensor unit 20, and second solder bumps 40 can be situated on the first sensor unit, and subsequently second sensor unit 20 can be soldered onto first sensor system 10 with first solder bumps 30.

Inputs and outputs of second sensor unit 20 that are externally not directly contacted may be supplied or read out via ASIC wafer 4, and then are externally outputted together with the inertial measurement variables via an interface (e.g. SPI, I$^2$C, etc.) on inertial ASIC wafer 4.

Of course, instead of a 6D inertial sensor, with the design according to the present invention sensors having fewer evaluation variables are also conceivable, such as for example a pure acceleration sensor (1-3D) or a pure rotational speed sensor (1-3D). In addition, it is also possible for the inertial sensor to measure additional physical quantities such as pressure, temperature, humidity, or the like, thus in this way realizing a 7D, 8D, or 9D sensor. In addition, second sensor unit 20 can contain not only one magnetic sensor but can also measure additional or alternative physical quantities, so that as a result a 4D, 5D, 6D sensor, or the like, can be realized.

Figure 2:
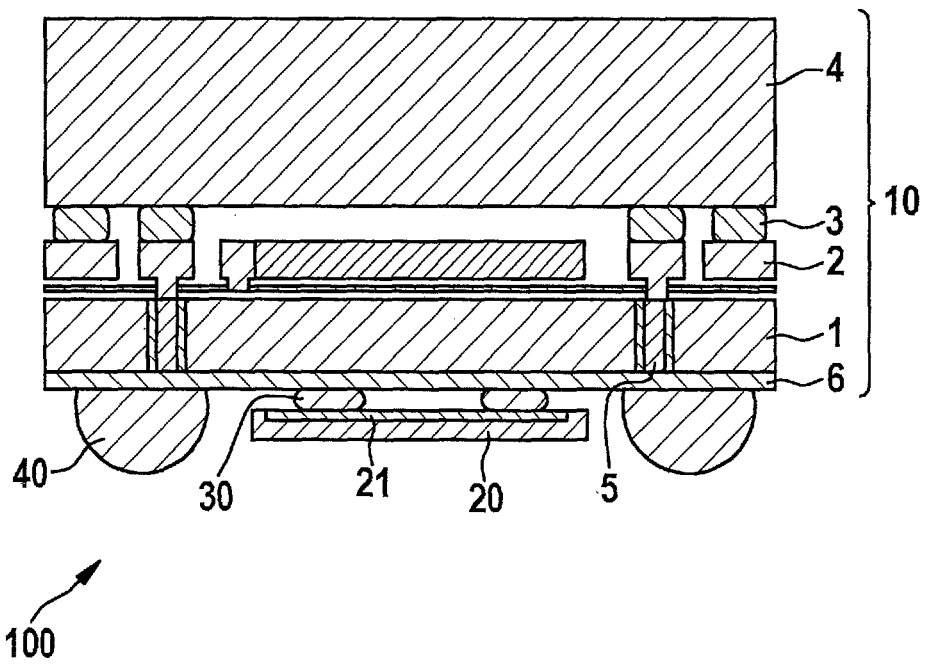
FIG. 2 shows a further specific embodiment of a sensor device according to the present invention.

FIG. 2 shows a sectional view of a further specific embodiment of a sensor device 100 according to the present invention. In this variant, electrical vias 5 are fashioned in MEMS substrate 1, and electrical redistribution layer 6 is situated on the rear side of MEMS substrate 1. A flip-chip assembly of second sensor unit 20 (e.g. a magnetic sensor) takes place on the rear side of MEMS substrate 1 using small first solder bumps 30, and an external contacting via large second solder bumps 40 likewise takes place on the rear side of MEMS substrate 1.

As a result, ASIC wafer 4 does not require electrical vias 5, because all external inputs and outputs are conducted to second sensor unit 20 via electrical vias 5 in MEMS substrate 1. Micromechanical functional layer 2 can be deposited onto MEMS substrate 1 via semiconductor-like deposition processes, and alternatively it is also possible to carry out the deposition processes via wafer bonding methods and subsequent grinding back, contacting, and structuring.

In a further variant (not shown in a Figure) of sensor device 100 according to the present invention, which corresponds essentially to the specific embodiment of FIG. 1, it is also possible instead of a magnetic sensor to fasten a microcontroller on the inertial sensor, the microcontroller carrying out a signal pre-processing and outputting the pre-processed data externally. In this way, advantageously a main application processor (e.g. of a mobile telephone; not shown) can be relieved of load, or pre-processed data can be provided even in applications in which a powerful application processor is not available. It is also conceivable here for the first integrated sensor already to represent a complete 9D module (or 10D, 11D, 12D, etc.).

Figure 3:
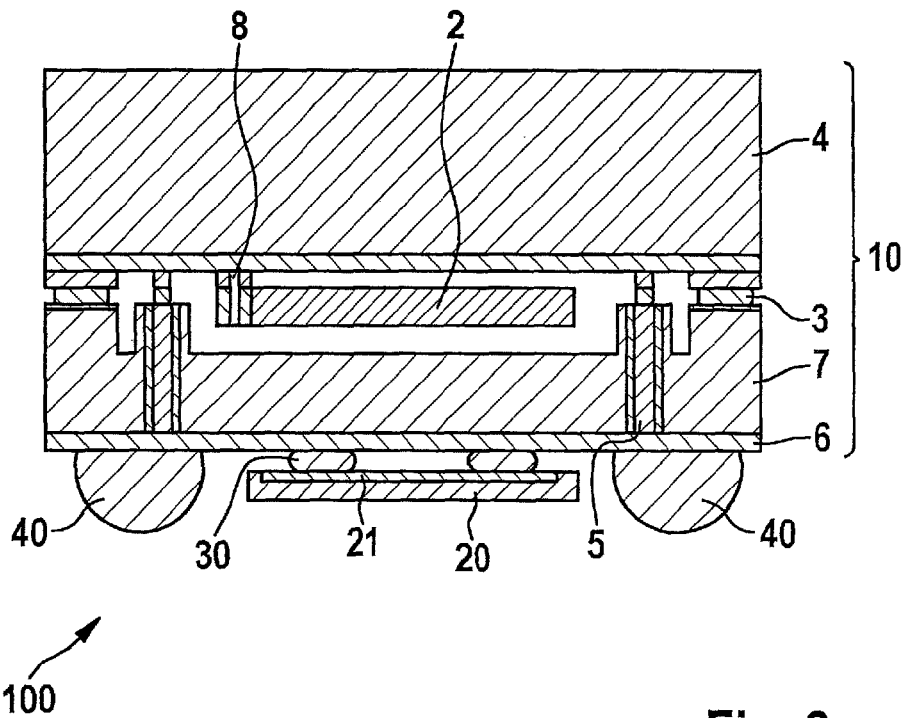
FIG. 3 shows a further specific embodiment of the sensor device according to the present invention.

FIG. 3 shows a sectional view of an alternative specific embodiment of sensor device 100 according to the present invention in which external electrical vias 5 are fashioned in a capping wafer 7. In this variant, micromechanical functional layer 2 is bonded onto ASIC wafer 4 as a wafer (for example using a low-temperature bonding method) and is thinned back. Subsequently, contact holes 8 are fashioned between micromechanical functional layer 2 and ASIC wafer 4, and are filled completely or partly with metal (for example tungsten). In a following process step, the actual MEMS functional structure is trenched and also exposed. In this case, capping wafer 7 is bonded directly on ASIC wafer 4. Capping wafer 7 can be a further ASIC wafer having an active circuit, and in this way a still higher integration density of sensor device 100 can be achieved.

Figure 4:
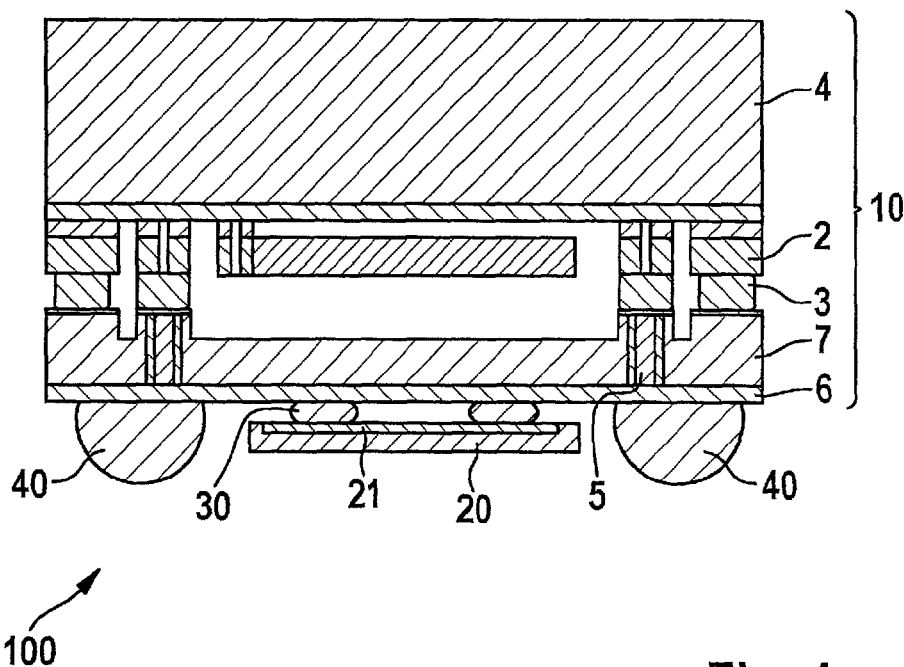
FIG. 4 shows a further specific embodiment of the sensor device according to the present invention.

FIG. 4 shows an alternative to the specific embodiment of FIG. 3; in this case, capping wafer 7 with electrical vias 5 is not bonded onto ASIC wafer 4, but rather onto micromechanical functional layer 2.

The design according to the present invention enables a situation and electrical connection of a separate magnetic sensor chip underneath a vertically integrated inertial sensor, via a flip-chip connection having small solder bumps. The external contacting to the circuit board takes place via larger solder bumps on the underside of the inertial sensor. According to the present invention, in this way two complete, independent, integrated sensor modules are functionally connected to one another.

Advantageously, such a sensor module 100, in which first sensor unit 10 is for example a 6D inertial sensor and second sensor unit 20 is a 3D magnetic sensor, has the same footprint as the 6D inertial sensor alone, and the difference in constructive heights is small, or even zero, compared to the 6D inertial sensor alone. Due to the unhoused bare-die design, the footprint and the constructive height are in addition significantly smaller than in the case of sensors having plastic packaging.

In addition, advantageously the product costs of this 6D plus 3D system are lower than in the case of a 9D sensor, which contains the entire evaluation function in a single ASIC. In the case of a 9D evaluation ASIC realized conventionally, the overall chip surface of the ASIC, which in general is dominated by the most complex function, namely that of rotational speed sensing, would be subject to the additional production costs for the magnetic sensor system, and this would make the product significantly more expensive.

Advantageously, in addition a 6D inertial module and a 3D magnetic sensor can be configured, processed, and even marketed separately as individual products, independently of one another. Process complexity, and also yields, can therefore come out better with the design according to the present invention than in the case of a 9D one-chip sensor module.

Figure 5:
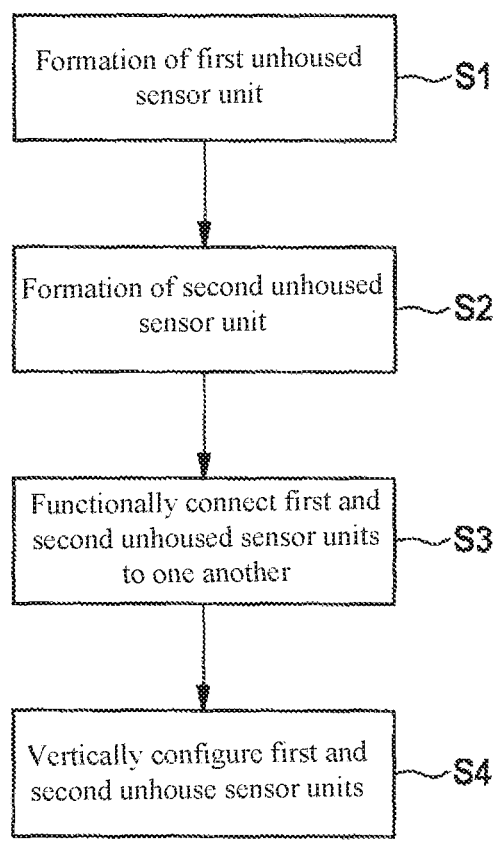
FIG. 5 shows a schematic sequence of a specific embodiment of the method according to the present invention.

FIG. 5 shows a schematic sequence of a specific form of the method according to the present invention.

In a first step S1, a formation is carried out of a first unhoused sensor unit 10.

In a second step S2, a formation is carried out of at least one second unhoused sensor unit 20.

In a third step S3, the two sensor units 10, 20 are functionally connected to one another.

Finally, in a fourth step S4 a configuration vertically to one another is carried out of the two sensor units 10, 20, in such a way that the two sensor units 10, 20 are essentially configured vertically one over the other in such a way that a sensor unit 10 having a larger footprint completely covers a sensor unit 20 having a smaller footprint.

In sum, the present invention connects an arbitrary vertically integrated first sensor and an arbitrary second sensor to one another via small solder bumps, according to specific geometric specifications, one of the two integrated sensors being contacted externally via large solder bumps, and the sensor units doing without any plastic, ceramic, or metal packaging or the like (bare-die design). In this way, a high degree of functional integration is supported with comparatively low process complexity and low process costs, because two sensors having specific functions and production steps can be initially separately configured and produced.

A precondition for the configuration is that the two sensors have a minimum difference in their footprints that permits the application of the external solder bumps on the larger sensor. In addition, after the soldering onto the application circuit board, the constructive height of the smaller sensor plus the height of the smaller solder bumps must be smaller than the height of the larger solder bumps.

Although the present invention has been described on the basis of concrete exemplary embodiments, the present invention of course enables a large number of different sensor designs not described above. In particular, an assignment of first sensor unit 10 to a specific sensor type, and an assignment of the second sensor unit to a specific sensor type, can be chosen arbitrarily and freely.

For example, the design according to the present invention can advantageously also be realized if only a single length dimension of the second sensor unit differs from a corresponding length dimension of the first sensor unit.

The person skilled in the art will thus be able to modify the described features or combine them with one another without departing from the core idea of the present invention.

What is claimed is:

1. A micromechanical sensor device, comprising:
    a first unhoused sensor unit; and
    at least one second unhoused sensor unit, the second unhoused sensor unit having a smaller footprint than the first unhoused sensor unit;
    wherein:
        the sensor units are functionally connected to one another,
        the sensor units are essentially vertically configured one over the other so that the first sensor unit completely covers the second sensor unit,
        the sensor units are functionally connected to one another by first solder bumps,
        the sensor device externally contactable by second solder bumps, and
        a vertical extension of the second solder bumps is larger than an overall vertical extension of the first solder bumps and the second sensor unit.

2. The sensor device of claim 1, wherein the first sensor unit includes a MEMS structure and an ASIC wafer.

3. The sensor device of claim 2, wherein an electrically conductive bonded connection is provided between the first and second sensor units, wherein electrical vias are provided in the ASIC wafer, and wherein the first and second sensor units are electrically contactable to one another by the bonded connection and the vias.

4. The sensor device of claim 2, wherein the ASIC wafer has an electrical redistribution device.

5. The sensor device of claim 1, wherein the second sensor unit has at least one of a magnetic sensor, an ASIC chip, a radio module, and a microcontroller.

6. The sensor device of claim 1, wherein the first sensor unit is a 9D sensor.

7. The sensor device of claim 3, wherein the first sensor unit has a capping wafer, wherein the second sensor unit is situated on the capping wafer, wherein the capping wafer has electrical vias, and wherein the capping wafer is bonded onto the ASIC wafer by the bonded connection.

8. The sensor device of claim 7, wherein the capping wafer is bonded by the bonded connection onto a micromechanical functional layer of the MEMS structure.

9. The sensor device of claim 7, wherein the capping wafer includes another ASIC wafer.

10. A method for producing a micromechanical sensor device, the method comprising:
    forming a first unhoused sensor unit;
    forming at least one second unhoused sensor unit, the second unhoused sensor unit having a smaller footprint than the first unhoused sensor unit;
    functionally connecting the sensor units; and
    vertically configuring, relative to one another, the first and second sensor units, so that the first and second sensor units are essentially configured vertically one over the other so that first sensor unit completely covers the second sensor unit having a smaller footprint, wherein:
        the sensor units are functionally connected to one another by first solder bumps,
        the sensor device externally contactable by second solder bumps, and
        a vertical extension of the second solder bumps is larger than an overall vertical extension of the first solder bumps and the second sensor unit.

11. The method of claim 10, wherein the first sensor unit includes a MEMS substrate having a micromechanical functional layer and an ASIC wafer, and wherein the second sensor unit includes at least one of a magnetic sensor, an ASIC chip, a radio module, and a microcontroller.

* * * * *